United States Patent
Lin et al.

(10) Patent No.: US 9,978,728 B2
(45) Date of Patent: May 22, 2018

(54) DISPLAY APPARATUS AND FABRICATING METHOD THEREOF

(71) Applicants: Innolux Corporation, Miao-Li County (TW); Advanced Optoelectronic Technology Inc., Hsinchu county (TW)

(72) Inventors: Chun-Hsien Lin, Miao-Li County (TW); Tsau-Hua Hsieh, Miao-Li County (TW); Po-Min Tu, Miao-Li County (TW); Tzu-Chien Hung, Miao-Li County (TW); Chien-Chung Peng, Miao-Li County (TW); Shih-Cheng Huang, Miao-Li County (TW)

(73) Assignees: Innolux Corporation, Miao-Li County (TW); Advanced Optoelectronics Technology Inc., Hsinchu county (TW)

( * ) Notice: Subject to any disclaimer, the term of this patent is extended or adjusted under 35 U.S.C. 154(b) by 0 days. days.

(21) Appl. No.: 15/603,482

(22) Filed: May 24, 2017

(65) Prior Publication Data
US 2017/0345801 A1 Nov. 30, 2017

Related U.S. Application Data

(60) Provisional application No. 62/341,092, filed on May 25, 2016.

(30) Foreign Application Priority Data

Oct. 14, 2016 (TW) .............................. 105133247 A (51) Int. Cl.
*H01L 33/00* (2010.01)
*H01L 25/075* (2006.01)
(Continued)

(52) U.S. Cl.
CPC ........ *H01L 25/0753* (2013.01); *H01L 25/075* (2013.01); *H01L 25/0756* (2013.01);
(Continued)

(58) Field of Classification Search
None
See application file for complete search history.

(56) References Cited

U.S. PATENT DOCUMENTS 5,929,474 A * 7/1999 Huang ................ H01L 27/3248
257/114
2006/0163589 A1 * 7/2006 Fan ........................ H01L 27/153
257/88

(Continued)

FOREIGN PATENT DOCUMENTS

TW 201225728 6/2012
TW 201419614 5/2014

OTHER PUBLICATIONS

"Office Action of Taiwan Counterpart Application," dated May 26, 2017, p. 1-p. 5, in which the listed references were cited.

*Primary Examiner* — Minh-Loan Tran
(74) *Attorney, Agent, or Firm* — JCIPRNET (57) ABSTRACT

A display apparatus and a fabricating method thereof are provided. The display apparatus includes a substrate, a light emitting diode, a first bump, a first insulating layer and a second insulating layer. The light emitting diode has a first surface and a second surface opposite each other, wherein the first surface faces the substrate. The light emitting diode is bonded to the substrate through the first bump. The first insulating layer is disposed on a periphery of the first bump and the light emitting diode, and contacts the first bump and the first surface. The second insulating layer is disposed on the substrate and surrounds at least a portion of the first insulating layer.

20 Claims, 12 Drawing Sheets

(51) Int. Cl.
*H01L 25/16* (2006.01)
*H01L 27/12* (2006.01)
*H01L 27/15* (2006.01)
*H01L 33/48* (2010.01)
*H01L 33/54* (2010.01)
*H01L 33/62* (2010.01)

(52) U.S. Cl.
CPC ........ *H01L 25/167* (2013.01); *H01L 27/1214* (2013.01); *H01L 27/15* (2013.01); *H01L 33/0079* (2013.01); *H01L 33/486* (2013.01); *H01L 33/54* (2013.01); *H01L 33/62* (2013.01); *H01L 2933/005* (2013.01); *H01L 2933/0033* (2013.01); *H01L 2933/0066* (2013.01)

(56) References Cited

U.S. PATENT DOCUMENTS

2008/0210957 A1* 9/2008 Watanabe ........... H01L 21/0242
  257/89
2017/0179192 A1* 6/2017 Zhang .................... H01L 23/29

* cited by examiner

DISPLAY APPARATUS AND FABRICATING METHOD THEREOF

CROSS-REFERENCE TO RELATED APPLICATION

This application claims the priority benefits of U.S. provisional application Ser. No. 62/341,092, filed on May 25, 2016 and Taiwan application serial no. 105133247, filed on Oct. 14, 2016. The entirety of each of the above-mentioned patent applications is hereby incorporated by reference herein and made a part of this specification.

BACKGROUND

Technical Field

The disclosure relates to an apparatus and a fabricating method thereof, and more particularly to a display apparatus and a fabricating method thereof.

Description of Related Art

Due to advantages such as active light emission, high brightness, high contrast and low power consumption, as well as longer life than organic light emitting diode (OLED) display apparatuses, light emitting diode (LED) display apparatuses have recently become one of the technologies for new type displays that are under active development. To meet the need for high resolution, the light emitting diode display apparatuses are developing into being composed of an active device array substrate and micron-sized light emitting diodes arranged in an array.

SUMMARY

The disclosure provides a display apparatus having a protective insulating layer structure.

The disclosure provides a fabricating method of a display apparatus, wherein an insulating layer buffers a force acting during bonding of a light emitting diode to a substrate.

The display apparatus according to the disclosure includes a substrate, a light emitting diode, a first bump, a first insulating layer and a second insulating layer. The light emitting diode has a first surface and a second surface opposite each other, wherein the first surface faces the substrate. The light emitting diode is bonded to the substrate through the first bump. The first insulating layer is disposed on a periphery of the first bump and the light emitting diode, and contacts the first bump and the first surface. The second insulating layer is disposed on the substrate and surrounds at least a portion of the first insulating layer.

The fabricating method of a display apparatus according to the disclosure includes the following steps. On a light emitting diode, at least one first bump is formed electrically connected to the light emitting diode. A first insulating layer is formed, wherein the first insulating layer is disposed on at least a periphery of the first bump and contacts the first bump, and surrounds at least a portion of the light emitting diode. The first bump is bonded to a first electrode of a substrate, so as to bond the light emitting diode to the substrate. A second insulating layer is formed on the substrate, wherein the second insulating layer surrounds at least a portion of the light emitting diode.

Based on the above, in the disclosure, the first insulating layer is disposed on a periphery of the bump and the light emitting diode and contacts the bump and the first surface; the second insulating layer surrounds at least a portion of the first insulating layer. Accordingly, a force acting during bonding of the light emitting diode to the substrate is buffered, or effects such as light shielding or protection are produced on the light emitting diode. In this way, the display apparatus including the light emitting diode has good device characteristics or yield.

To make the above features and advantages of the disclosure more comprehensible, several embodiments accompanied with drawings are described in detail as follows.

DETAILED DESCRIPTION OF DISCLOSED EMBODIMENTS

Figure 1A:
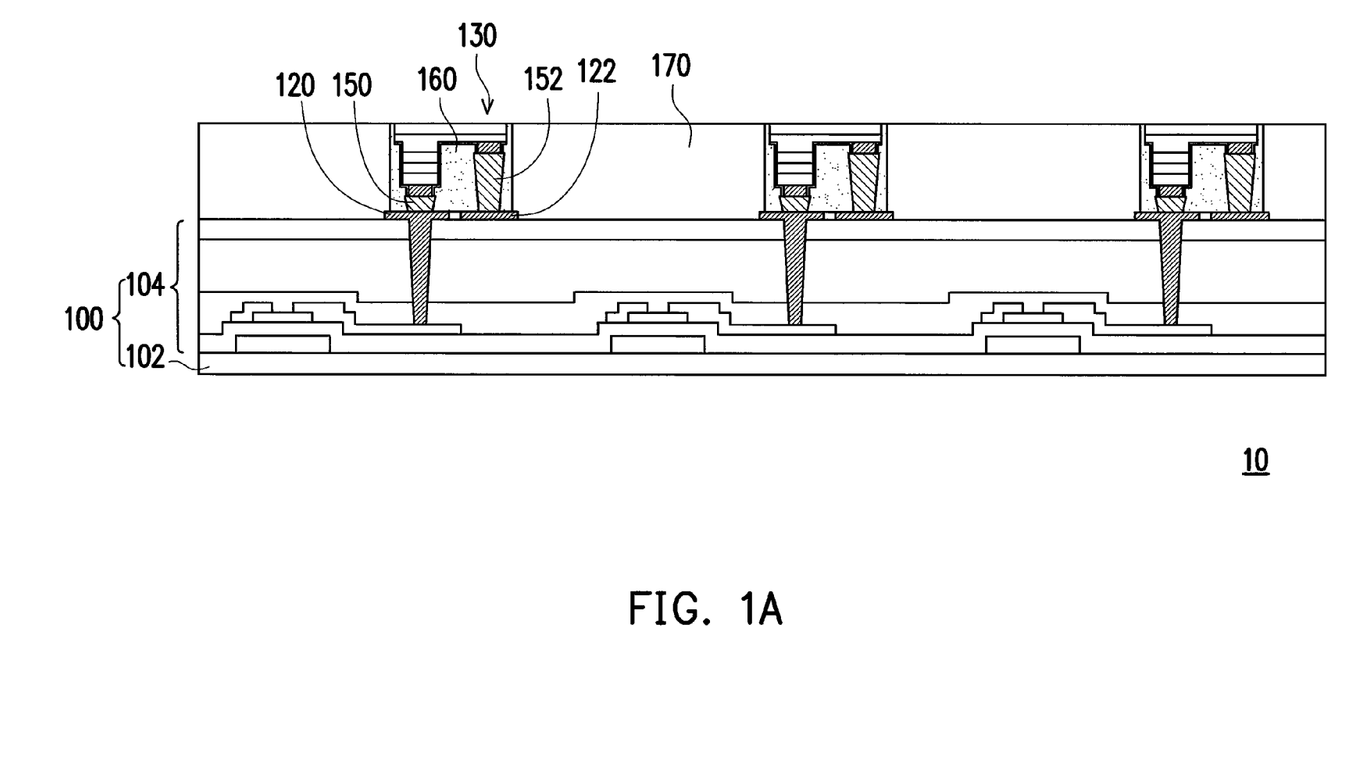
FIG. 1A is a cross-sectional schematic view of a display apparatus according to an embodiment of the disclosure.
Figure 1B:
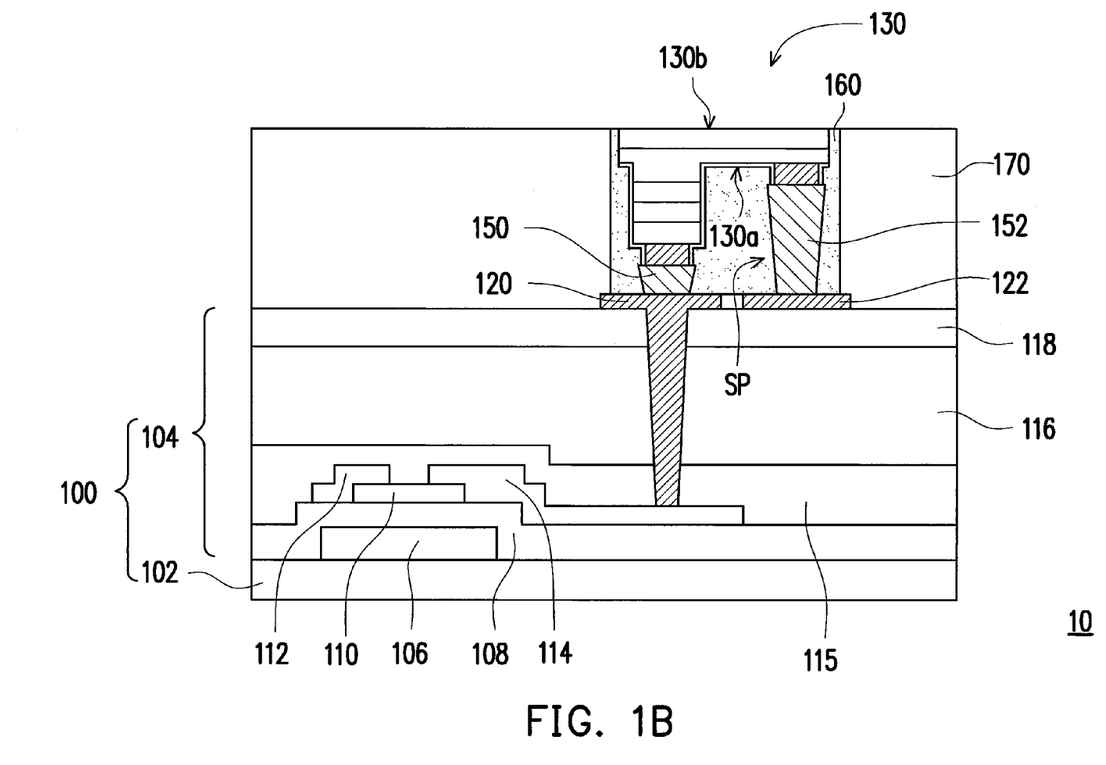
FIG. 1B is an enlarged partial view of FIG. 1A.

FIG. 1A is a cross-sectional schematic view of a display apparatus according to an embodiment of the disclosure, and FIG. 1B is an enlarged partial view of FIG. 1A. It is worth mentioning that, although the display apparatus in the following embodiment includes a plurality of light emitting diodes, the disclosure is not limited thereto. In other embodiments, the display apparatus may include only one light emitting diode. Referring to FIGS. 1A and 1B together, in the present embodiment, a display apparatus 10 includes a substrate 100, a light emitting diode 130, at least one bump (a first bump 150 and a second bump 152), a first insulating layer 160 and a second insulating layer 170.

In detail, the substrate 100, for example, includes a substrate 102, an active device 104 disposed on the substrate 102, and a first electrode 120 and a second electrode 122 electrically connected to the active device 104. In the present embodiment, the substrate 100, for example, includes a plurality of active devices 104 arranged in an array, a plurality of first electrodes 120 and a plurality of second electrodes 122. In the present embodiment, the active device 104 is, for example, an amorphous silicon thin-film transistor, a low-temperature polycrystalline silicon thin-film transistor, a silicon-based thin-film transistor, a micro-silicon thin-film transistor, or a transparent thin-film transistor or the like. In addition, in the present embodiment, the active device 104, for example, includes a gate 106, a gate insulating layer 108, a channel layer 110, a source 112, a drain 114, a dielectric layer 115, a first protection layer 116 and a second protection layer 118. A material of the first protection layer 116 is, for example, an organic material; a material of the second protection layer 118 is, for example, an inorganic material such as silicon oxide, silicon nitride, silicon oxynitride and so on. However, the disclosure is not limited thereto. Although a thin-film transistor having a structure as shown in FIG. 1B is used as the active device in the present embodiment, it is of course possible in other embodiments that the thin-film transistor has other structure, or a device other than a thin-film transistor is used as the active device.

In the present embodiment, the first electrode 120 and the second electrode 122 are, for example, located on a surface of the second protection layer 118. The first electrode 120 is, for example, electrically connected to the drain 114, and the second electrode 122 is, for example, a common electrode. However, the disclosure is not limited thereto. The first electrode 120 and the second electrode 122 may include the same or different materials. In the present embodiment, the first electrode 120 is, for example, a positive electrode, and a material thereof is, for example but not limited to, copper, titanium, nickel, silver, gold, indium or other suitable conductive material. The second electrode 122 is, for example, a negative electrode, and a material thereof is, for example but not limited to, copper, titanium, nickel, silver, gold, indium or other suitable conductive material. In the present embodiment, the second electrode 122 is, for example, a ground electrode. In the present embodiment, numbers of the active device 104, the first electrode 120 and the second electrode 122 are plural. However, the disclosure is not limited thereto. In other embodiments, the number of each of the active device 104, the first electrode 120 and the second electrode 122 may be one.

In the present embodiment, the display apparatus 10, for example, includes the first bump 150 and the second bump 152. The first bump 150 is, for example, disposed corresponding to the first electrode 120; the second bump 152 is, for example, disposed corresponding to the second electrode 122. The first bump 150 and the second bump 152 may be solid structures or hollow structures. A material of the first bump 150 and the second bump 152 is, for example but not limited to, a binary alloy, ternary alloy or multi-element alloy composed of metals such as copper, silver, gold, nickel, titanium, tin, indium, germanium, platinum, palladium and so on. The first bump 150 and the second bump 152 have a thickness of, for example, 0.1 μm to 20 μm. The thickness of the first bump 150 and the second bump 152 is, for example, 1% to 25% of a width of the light emitting diode 130. For example, if the width of the light emitting diode 130 is about 40 μm, the thickness of the first bump 150 is about 3 μm and the thickness of the second bump 152 is about 4 μm.

In the present embodiment, the display apparatus 10, for example, includes a plurality of light emitting diodes 130 that are, for example, arranged in an array on the substrate 100. The light emitting diode 130 is, for example, a flip-chip light emitting diode, and may be an organic light emitting diode, a micro light emitting diode or other diode. Specifically, the light emitting diode 130 includes a red light emitting diode, a green light emitting diode, a blue light emitting diode or a light emitting diode of other color. The light emitting diode 130 has a width of, for example, 5 μm to 200 μm, and a thickness of, for example, 1 μm to 20 μm, and has a main light emitting area which is, for example, about 10% to 60% of the light emitting area. For example, the width of the light emitting diode 130 is about 40 μm, and the main light emitting area accounts for about 25%. The light emitting diode 130 is electrically connected to the first electrode 120 and the second electrode 122 respectively through the first bump 120 and the second bump 122, so as to be electrically connected to the substrate 100.

Referring to FIG. 1B, the light emitting diode 130, for example, includes an undoped semiconductor layer 131, a first type semiconductor layer 132a, an active layer 134, a second type semiconductor layer 132b, a first type electrode 136a, a second type electrode 136b and an insulating layer 140. In the present embodiment, the light emitting diode 130, for example, further includes a conductor layer 138 disposed between the first type semiconductor layer 132a and the first type electrode 136a for enhancing conductivity therebetween. In the present embodiment, the first type electrode 136a and the second type electrode 136b are, for example, bond pads. In the present embodiment, the first type electrode 136a is electrically connected to the corresponding first electrode 120 through, for example, the first bump 150, and the second type electrode 136b is electrically connected to the corresponding second electrode 122 through, for example, the second bump 152. In the present embodiment, the first type is, for example, p type, the second type is, for example, n type, the first electrode 120 is, for example, a positive electrode, and the second electrode 122 is, for example, a negative electrode.

In the present embodiment, the light emitting diode 130 includes a first surface 130a and a second surface 130b opposite each other. The first surface 130a is, for example, an inner surface facing the substrate 100, and the second surface 130b is, for example, an outer surface facing away from the substrate 100. In the present embodiment, since the light emitting diode 130 is a flip-chip micro light emitting diode, the first electrode 120 and the second electrode 122 are, for example, located on the same side of the light emitting electrode 130. Moreover, the first electrode 120 and the second electrode 122 are both located between the first surface 130a of the light emitting electrode 130 and the substrate 100.

Figure 3A:
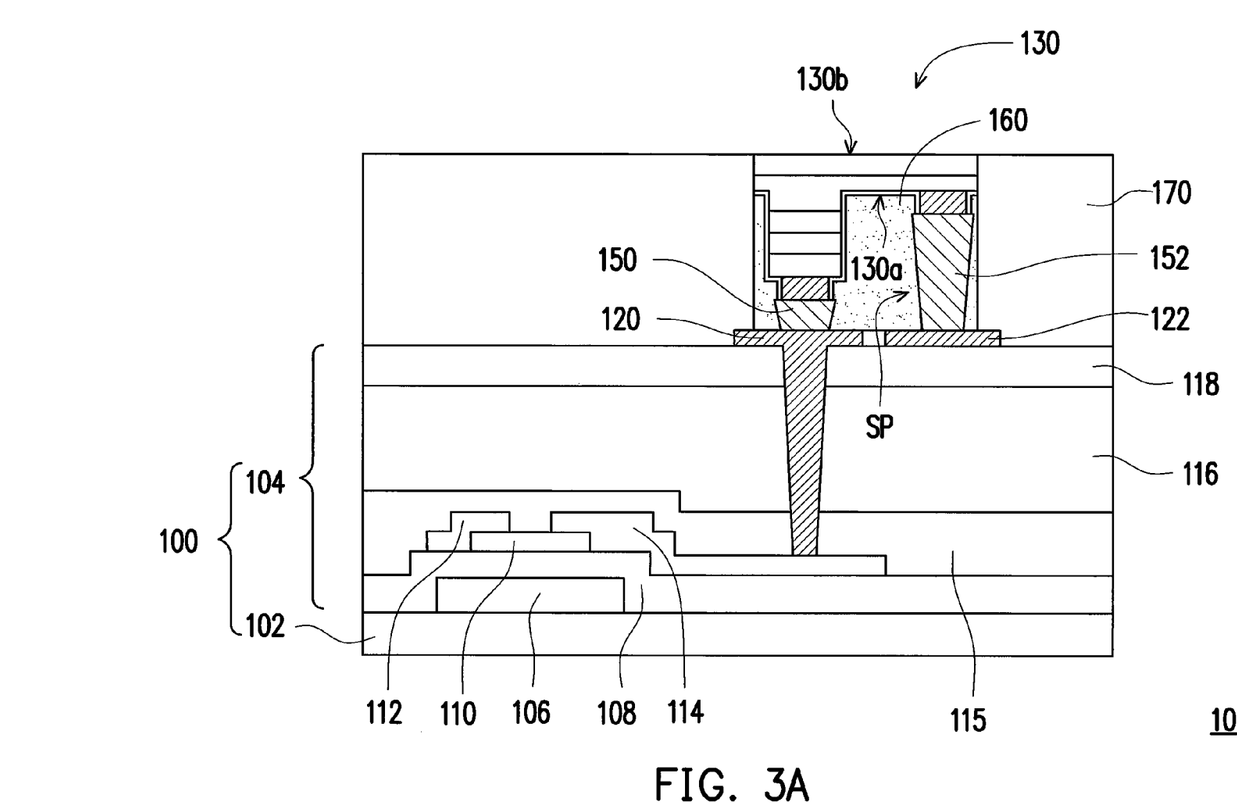
FIG. 3A is a cross-sectional schematic view of a display apparatus according to an embodiment of the disclosure.
Figure 3B:
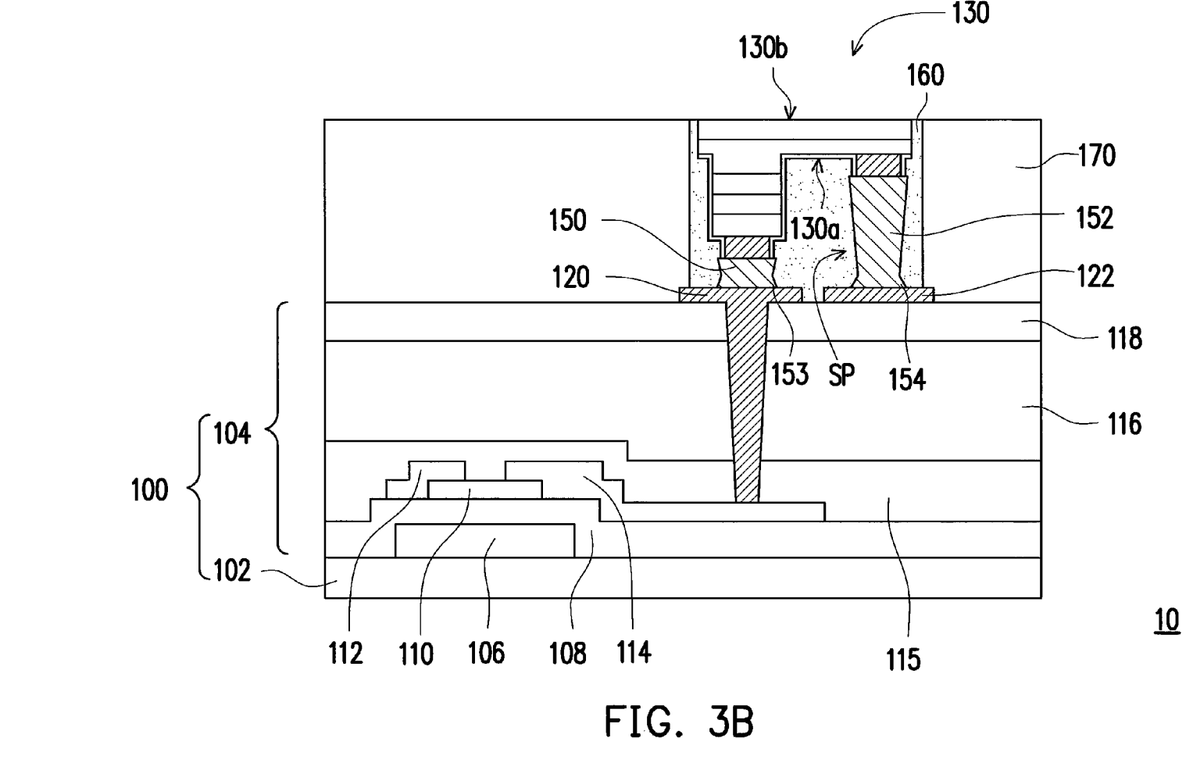
FIG. 3B is a cross-sectional schematic view of a display apparatus according to an embodiment of the disclosure.

In the present embodiment, the first insulating layer 160 is disposed on a periphery of at least one of the first bump 150 and the second bump 152 and of the light emitting diode 130, and contacts the at least one of the first bump 150 and the second bump 152 and the first surface 130a. In the present embodiment, the first insulating layer 160, for example, surrounds and covers the first bump 150 and the second bump 152, and surrounds the light emitting diode 130. In addition, the first insulating layer 160 is further disposed between the first bump 150 and the second bump 152 that are adjacent to each other. Specifically, the first insulating layer 160, for example, substantially completely fills a containing space SP formed between the light emitting diode 130, the first bump 150 and the second bump 152, and surrounds the first bump 150, the second bump 152 and the light emitting diode 130, thereby providing support, protection and stability to the light emitting diode 130, the first bump 150 and the second bump 152. A bottom surface of the first insulating layer 160 is, for example, flush with top surfaces of the first electrode 120 and the second electrode 122. In addition, in the present embodiment, the first insulating layer 160 further contacts an uppermost surface (i.e., an upper surface of the second protection layer 118) of the substrate 100 so as to further stabilize the aforementioned components. A material of the first insulating layer 160 may be but not limited to a transparent material, a light absorbing black material or a light reflecting white material. Specifically, the material of the first insulating layer 160 includes but not limited to glue, resin, silicon oxide, silicon nitride, or an underfiller. The first insulating layer 160 has a thickness of, for example, 1 μm to 20 μm. For example, the width of the light emitting diode 130 is about 40 μm, the thickness of the first insulating layer 160 in FIG. 3A is about 5 μm, and the thickness of the first insulating layer 160 in FIG. 3B is about 8 μm. Moreover, although the first insulating layer 160 in the present embodiment is solid, the first insulating layer 160 in other embodiments may substantially include an air gap. In addition, although the first insulating layer 160 in the present embodiment exposes a portion (i.e., an outer edge portion) of the first electrode 120 and a portion (i.e., an outer edge portion) of the second electrode 122, in an embodiment (not illustrated), the first insulating layer 160 may cover an outer edge of at least one of the first electrode 120 and the second electrode 122.

In the present embodiment, the second insulating layer 170 is disposed on the substrate 100 and surrounds at least a portion of the light emitting diode 130. In the present embodiment, the second insulating layer 170 further surrounds a portion of the first insulating layer 160. Specifically, if the first bump 150, the second bump 152, the light emitting diode 130 and the first insulating layer 160 are defined as a light emitting unit, the second insulating layer 170, for example, surrounds the light emitting unit and is located between two adjacent light emitting units. In this way, the second insulating layer 170 further stabilizes a position of the light emitting unit so that each light emitting unit is properly correspondingly disposed on the substrate 100. In addition, at least one of the first insulating layer 160 and the second insulating layer 170 covers the first electrode 120 and the second electrode 122. Specifically, the first insulating layer 160, for example, exposes the outer edge portions of the first electrode 120 and the second electrode 122, while the second insulating layer 170 covers them. The first insulating layer 160 and the second insulating layer 170 may include the same or different materials. A material of the second insulating layer 170 may be but not limited to a transparent material, a light absorbing black material or a light reflecting white material. Specifically, the material of the second insulating layer 170 includes but not limited to glue, resin, or an underfiller. The second insulating layer 170 has a thickness of, for example, 0.1 µm to 5.0 µm. In the present embodiment, a top surface of the second insulating layer 170 is, for example, not higher than the second surface 130b of the light emitting diode 130. Thus, the light emitting diode 130 exhibits a maximum elevation with respect to the substrate 102 and the top surface of the second insulating layer 170 is not higher than the maximum elevation. However, the disclosure is not limited thereto. Moreover, in an embodiment (not illustrated), the display apparatus 10 may further include an opposite substrate disposed opposite the substrate 100, so that the light emitting diode 130 is located the two substrates. In addition, referring to FIG. 3B, a first outward expansion portion 153 is formed by the first bump 150 and the first electrode 120 on an outer periphery of a junction of the first bump 150 and the first electrode 120, and a second outward expansion portion 154 is formed by the second bump 152 and the second electrode 122 on an outer periphery of a junction of the second bump 152 and the second electrode 122.

Figure 2A:
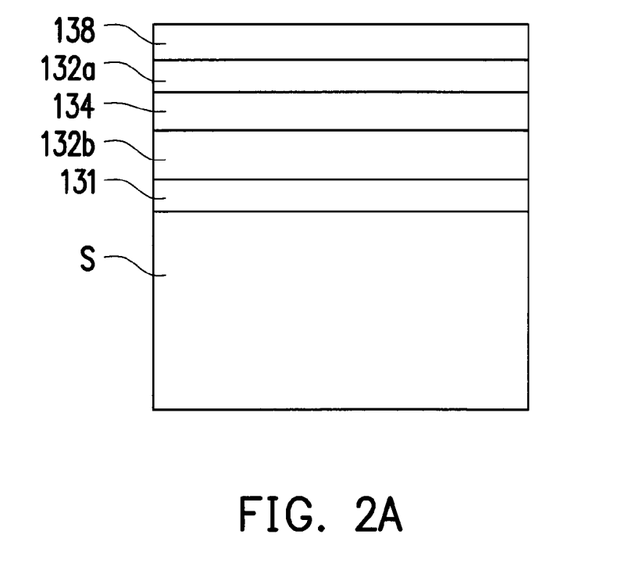
FIGS. 2A to 2G are schematic flowcharts of a fabricating method of a light emitting unit in the display apparatus in FIG. 1B.

Next, a fabricating method of a display apparatus is explained. FIGS. 2A to 2G are schematic flowcharts of a fabricating method of a light emitting unit in the display apparatus in FIG. 1B. Referring to FIG. 2A, first of all, the undoped semiconductor layer 131, the second type semiconductor layer 132b, the active layer 134, the first type semiconductor layer 132a and the conductor layer 138 are formed in sequence on an epitaxial substrate S. In terms of blue and green light emitting diodes, the epitaxial substrate S is, for example, a sapphire substrate or the like, and a material layer formed thereon by epitaxy may be formed mostly of InGaN. In terms of a red light emitting diode, the epitaxial substrate S may be a GaAs substrate or the like, and a material layer formed thereon by epitaxy may be formed mostly of AlGaInP. However, the disclosure is not limited thereto. Specifically, a material of the undoped semiconductor layer 131 is, for example, InGaN or other suitable material. The first type semiconductor layer 132a is formed of, for example, GaN doped with a first type dopant, or other suitable material such as GaN doped with magnesium. The active layer 134 is, for example, a multiple quantum well, and a material thereof is, for example but not limited to, InGaN/GaN or other suitable material. The second type semiconductor layer 132b is formed of, for example but not limited to, GaN doped with a second type dopant, or other suitable material such as GaN doped with silicon. The undoped semiconductor layer 131, the second type semiconductor layer 132b, the active layer 134 and the first type semiconductor layer 132a are formed by, for example but not limited to, metalorganic chemical vapor deposition (MOCVD). A material of the conductor layer 138 is, for example but not limited to, a transparent conductive material such as ITO, a metal such as nickel, silver or platinum, or a combination of a transparent conductive material and a Bragg reflector. The conductor layer 138 is formed by, for example but not limited to, evaporation.

Figure 2B:
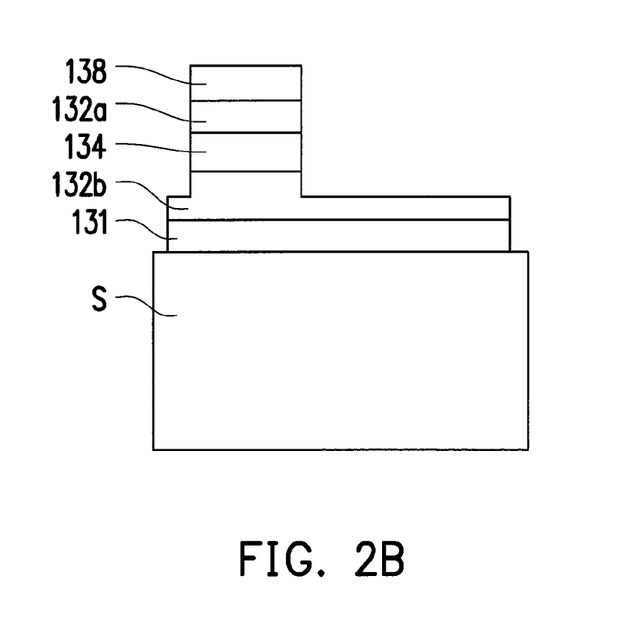

Referring to FIG. 2B, next, the second type semiconductor layer 132b, the active layer 134, the first type semiconductor layer 132a and the conductor layer 138 are partially removed to partially expose the second type semiconductor layer 132b. In this way, a mesa structure is formed, wherein the active layer 134, the first type semiconductor layer 132a and the conductor layer 138 are disposed on a portion of the second type semiconductor layer 132b. The second type semiconductor layer 132b, the active layer 134 and the first type semiconductor layer 132a are partially removed by, for example but not limited to, an etching process such as inductively coupled plasma (ICP) etching.

Figure 2C:
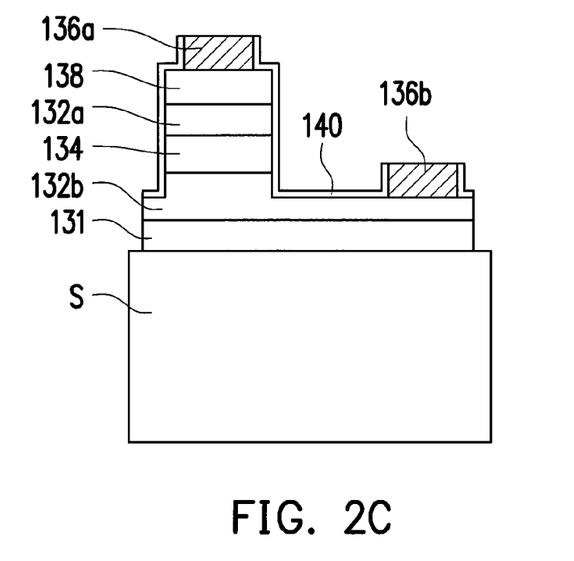

Referring to FIG. 2C, then, the first type electrode 136a and the second type electrode 136b are respectively formed on the first type semiconductor layer 132a and the second type semiconductor layer 132b, so as to form the light emitting diode 130. A material of the first type electrode 136a and the second type electrode 136b includes, for example but not limited to, chromium, platinum, gold or an alloy thereof. In the present embodiment, the first type electrode 136a is formed on, for example, the conductor layer 138. Then, the insulating layer 140 is formed on an exposed surface of the thus formed structure, wherein the insulating layer 140 covers a surface of the structure other than upper surfaces of the first type electrode 136a and the second type electrode 136b. A material of the insulating layer 140 is, for example but not limited to, silicon oxide. The insulating layer 140 is formed by, for example but not limited to, a chemical deposition process.

Figure 2D:
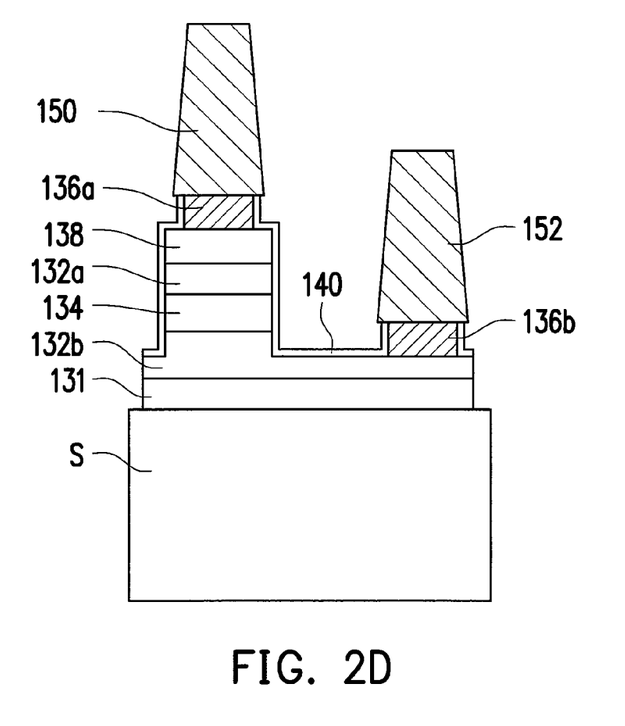

Referring to FIG. 2D, next, the first bump 150 and the second bump 152 are respectively formed on the first type electrode 136a and the second type electrode 136b. The first bump 150 and the second bump 152 are formed by, for example but not limited to, electroplating. The first bump 150 and the second bump 152, for example, have the same height. Therefore, a top of the first bump 150 is, for example, higher than that of the second bump 152.

Figure 2E:
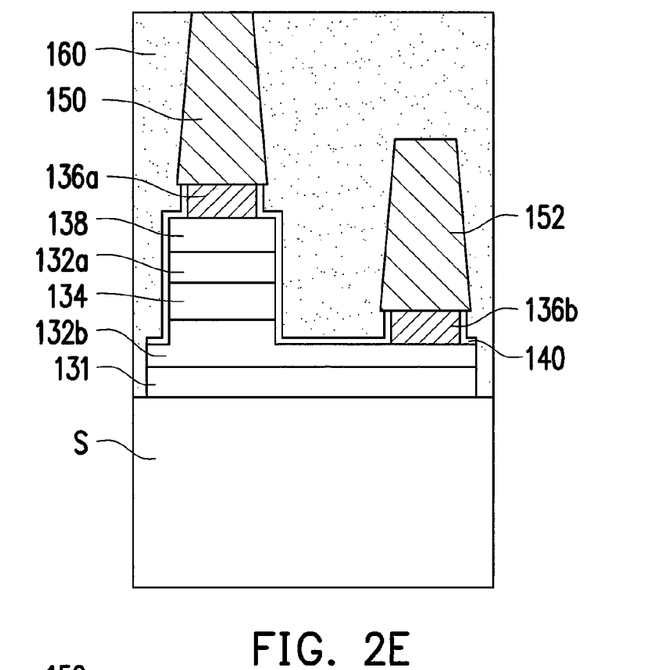

Referring to FIG. 2E, then, the first insulating layer 160 is formed on the first bump 150 and the second bump 152. In the present embodiment, the first insulating layer 160, for example, surrounds an entire sidewall of the mesa structure. Specifically, the first insulating layer 160, for example, surrounds entire sidewalls of the undoped semiconductor layer 131 and the second type semiconductor layer 132b. In the present embodiment, the first insulating layer 160 is formed by, for example but not limited to, a coating method. The first insulating layer 160 has a height, for example, flush with the first bump 150.

Figure 2F:
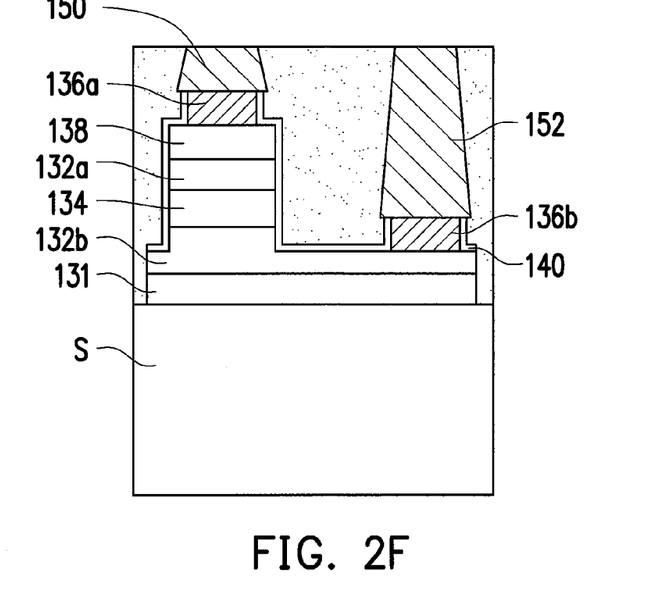

Referring to FIG. 2F, then, the first insulating layer 160 and the first bump 150 are partially removed, so that tops of the first bump 150, the second bump 152 and the first insulating layer 160 are flush with each other. In the present embodiment, a polishing process is performed on the first bump 150 and the first insulating layer 160 using, for example, the top of the second bump 152, as a polishing endpoint. The polishing process may be but not limited to a chemical mechanical polishing process.

Figure 2G:
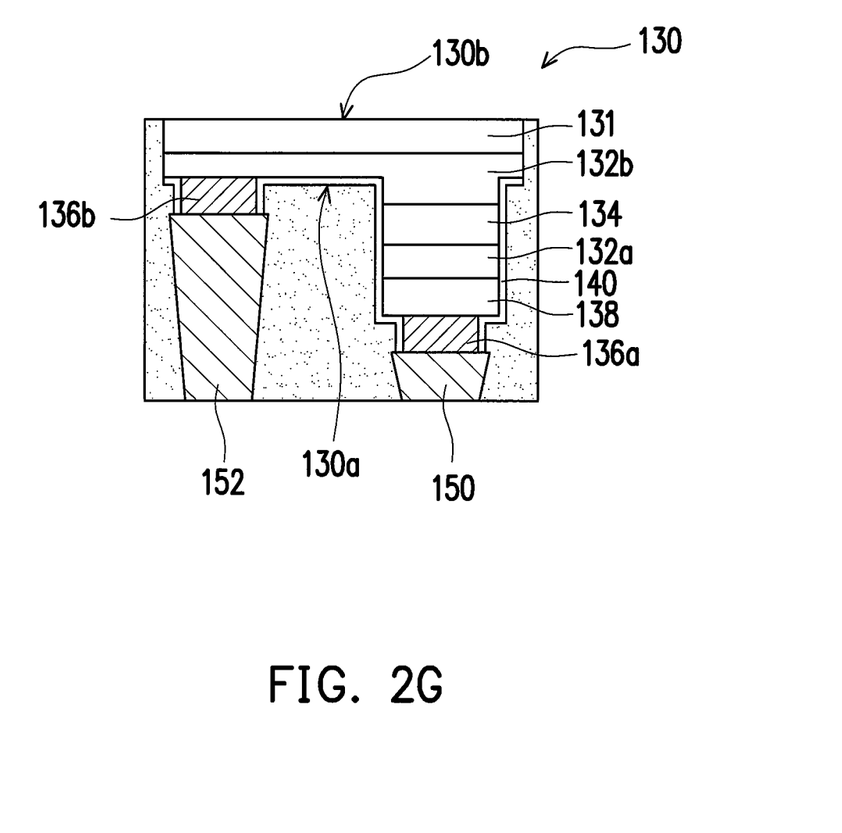

Referring to FIG. 2G, next, the thus formed structure is separated from the epitaxial substrate S. In the present embodiment, in terms of blue and green light emitting diodes, a separation method is, for example but not limited to, laser lift-off. The laser lift-off is performed using, for example, laser having a wavelength of 248 nm. In terms of a red light emitting diode, a separation method is, for example but not limited to, chemical lift-off. The chemical lift-off is performed using, for example but not limited to, a stripping liquid such as a mixture of ammonium hydroxide and hydrogen peroxide or a mixture of phosphoric acid and hydrogen peroxide.

Then, as shown in FIGS. 1A and 1B, the light emitting unit separated from the epitaxial substrate S is bonded to the substrate 100, and the second insulating layer 170 is formed after the bonding. It is worth mentioning that, during bonding of the light emitting unit to the substrate 100, a heating process at 50° C. to 250° C. is performed to soften the first bump 150 and the second bump 152 between the first electrode 120 and the light emitting diode 130 and between the second electrode 122 and the light emitting diode 130, and the light emitting diode 130 is bonded to the first electrode 120 and the second electrode 122 through the first bump 150 and the second bump 152. Generally, this heating process is likely to cause a problem of mismatch of thermal expansion coefficients of materials. However, in the present embodiment, since the structure including the first insulating layer 160 is adopted, the problem of mismatch of thermal expansion coefficients of materials is effectively alleviated, and the yield after die bonding is thus improved. Moreover, in the present embodiment, the bottom surface of the first insulating layer 160 is illustrated to be flush with the top surfaces of the first electrode 120 and the second electrode 122. However, in another embodiment, as shown in FIG. 3A, during the bonding step, the first insulating layer 160 may further fill a gap between the first electrode 120 and the second electrode 122. At this moment, the containing space SP as mentioned in this case is formed between the light emitting diode 130, the first bump 150, the second bump 152, the first electrode 120, the second electrode 122 and the substrate 100, and the first insulating layer 160, for example, completely fills the containing space SP.

Figure 4:
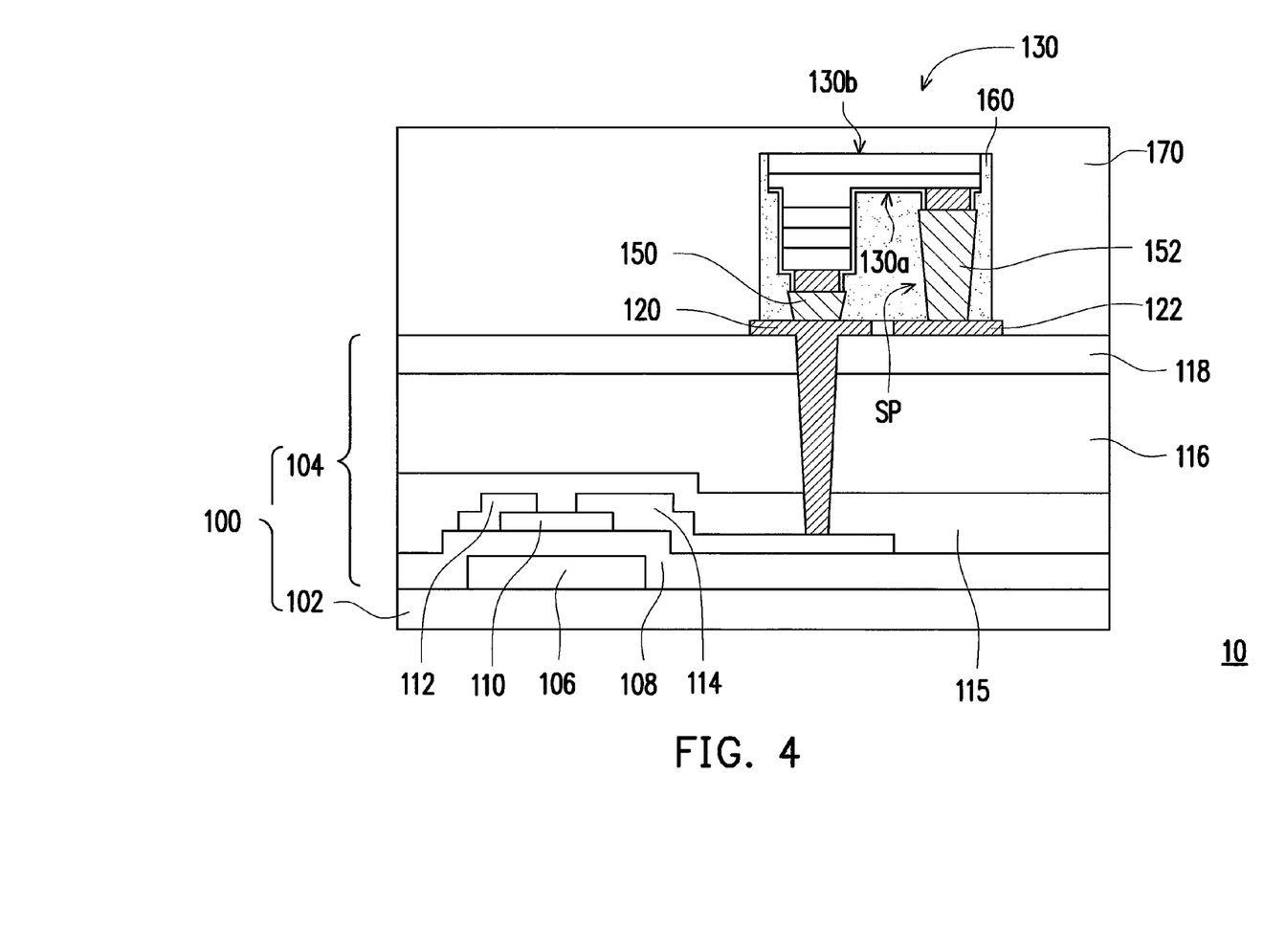
FIG. 4 is a cross-sectional schematic view of a display apparatus according to an embodiment of the disclosure.

It is worth mentioning that, in the present embodiment, the first insulating layer 160 surrounds the entire sidewalls of the undoped semiconductor layer 131 and the second type semiconductor layer 132b. However, the disclosure is not limited thereto. For example, in another embodiment, as shown in FIG. 3B, the first insulating layer 160 may expose a portion of a sidewall of the light emitting diode 130, such as the sidewalls of the undoped semiconductor layer 131 and the second type semiconductor layer 132b. Moreover, in an embodiment, as shown in FIG. 4, the top surface of the second insulating layer 170 may be higher than the second surface 130b of the light emitting diode 130 and covers the light emitting diode 130. Thus, the light emitting diode 130 exhibits a maximum elevation with respect to the substrate 102 and the top surface of the second insulating layer 170 is higher than the maximum elevation. In addition, to avoid total reflection, a refractive index of the second insulating layer 170 must be higher than that of the first insulating layer 160.

In the present embodiment, the first insulating layer 160 is disposed on the periphery of the first bump 150, the second bump 152 and the light emitting diode 130, and contacts the first bump 150, the second bump 152 and the first surface 130a, thus providing support to the light emitting diode 130. Moreover, in the steps of separating the light emitting diode 130 from the epitaxial substrate S and bonding the light emitting diode 130 to the substrate 100, generated stress is buffered, and the problem of mismatch of thermal expansion coefficients of materials due to heating is alleviated. In this way, the display apparatus 10 including the light emitting diode 130 has a good yield. Moreover, since the first insulating layer 160 further contacts the outer surface of the substrate 100, the first bump 150 and the second bump 152 are more stably fixed to the substrate 100, so that better bonding is achieved between the light emitting diode 130 and the substrate 100. The first insulating layer 160 further surrounds the light emitting diode 130, and moreover, the second insulating layer 170 is disposed between the light emitting diodes 130. Accordingly, the first insulating layer 160 and the second insulating layer 170 produce effects such as light shielding and protection on the light emitting diode 130, so that light emissions of pixels do not interfere with each other. Therefore, the display apparatus 10 has good device characteristics.

Figure 5A:
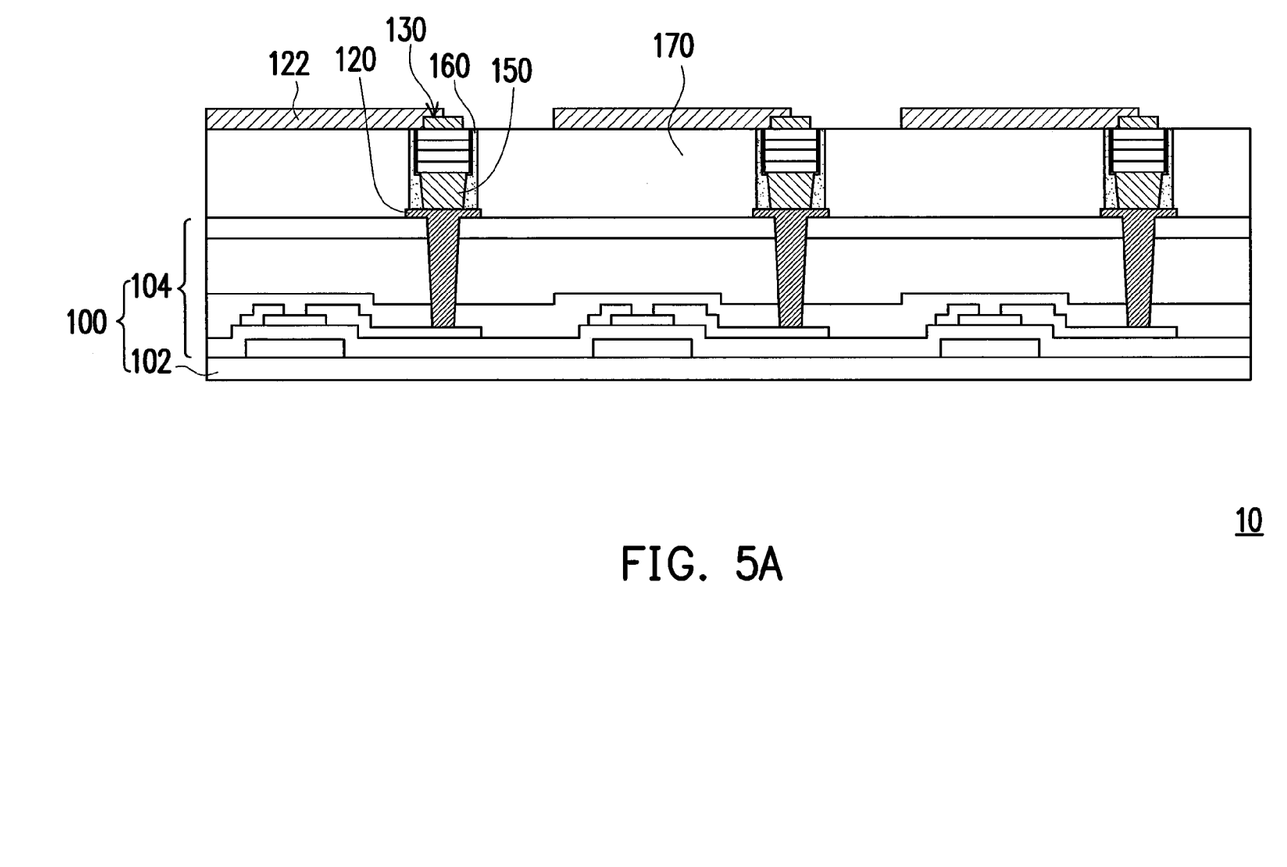
FIG. 5A is a cross-sectional schematic view of a display apparatus according to an embodiment of the disclosure.
Figure 5B:
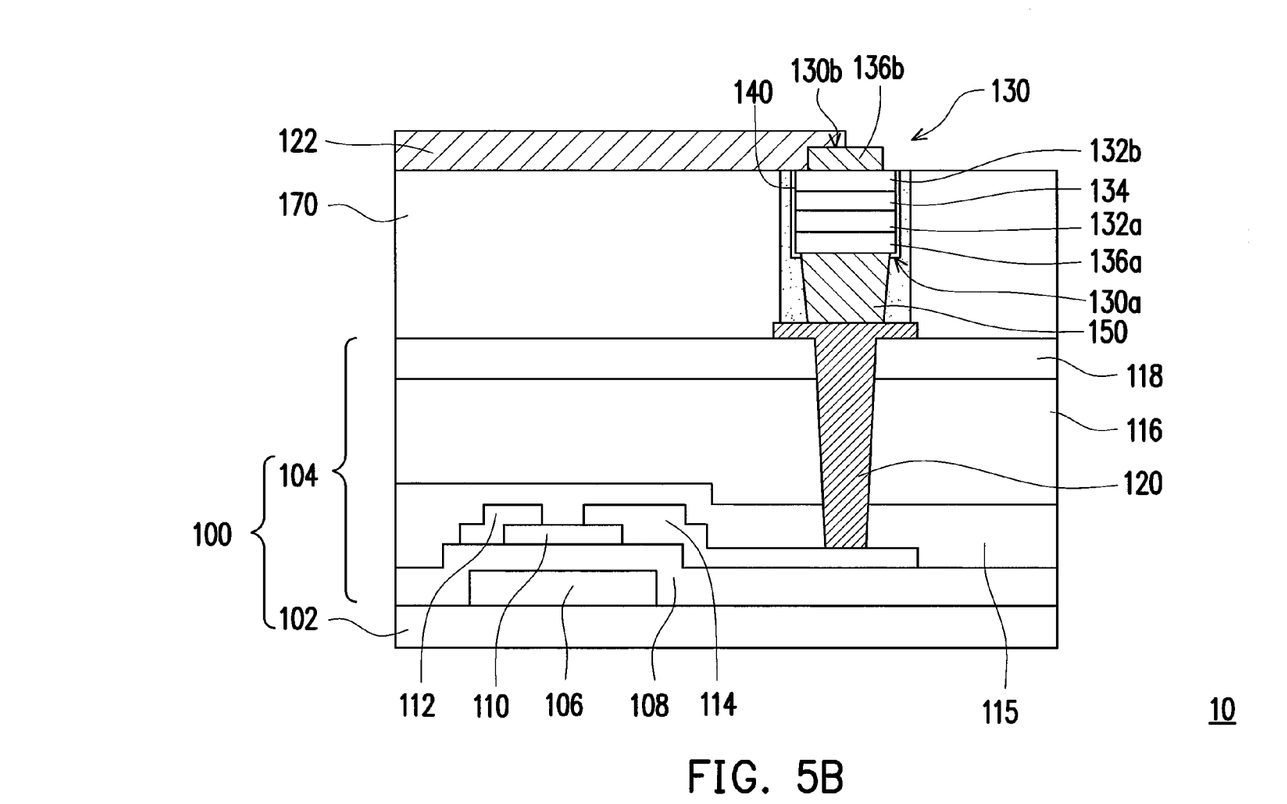
FIG. 5B is an enlarged partial view of FIG. 5A.

In the above embodiments, the disclosure is applied to a flip-chip light emitting diode. However, the disclosure is not limited thereto. Therefore, the following will explain application of the disclosure to a vertical light emitting diode. It is worth mentioning that the following explanation focuses on an overall structure of a display apparatus, and details of its components can be understood with reference to the above description and will not be repeated. FIG. 5A is a cross-sectional schematic view of a display apparatus according to an embodiment of the disclosure, and FIG. 5B is an enlarged partial view of FIG. 5A. Referring to FIGS. 5A and 5B together, the display apparatus 10 includes the substrate 100 having the first electrode 120 and the second electrode 122, the light emitting diode 130, the first bump 150, the first insulating layer 160 and the second insulating layer 170. In the present embodiment, the light emitting diode 130 is, for example, a micro vertical light emitting diode. Accordingly, the light emitting diode 130 is bonded to the substrate 100 through the first bump 150, and a second bump is omitted. The first electrode 120 and the second electrode 122 are, for example, located on two opposite sides of the light emitting diode 130. That is, the first electrode 120, the first bump 150, the light emitting diode 130 and the second electrode 122 are, for example, vertically stacked on the substrate 100. In the present embodiment, the first electrode 120 is, for example, electrically connected to the drain 114, and the second electrode 122 is, for example, a common electrode. However, the disclosure is not limited thereto.

In the present embodiment, the light emitting diode 130 has a structure as shown in FIG. 5B. Specifically, the light emitting diode 130, for example, includes the first type electrode 136a, the first type semiconductor layer 132a, the active layer 134, the second type semiconductor layer 132b and the second type electrode 136b. The first type electrode 136a is bonded to the first electrode 120 through the first bump 150. The second type electrode 136b is directly connected to the second electrode 122. In the present embodiment, the light emitting diode 130, for example, further includes the insulating layer 140, wherein the insulating layer 140, for example, covers side surfaces of the first type electrode 136a, the first type semiconductor layer 132a, the active layer 134 and the second type semiconductor layer 132b. In the present embodiment, the first type electrode 136a is, for example, a conductor layer, and a material thereof is, for example but not limited to, nickel, silver, gold or an alloy thereof. The second type electrode 136b is, for example, a bond pad, and a material thereof is, for example but not limited to, chromium, platinum, gold or an alloy thereof. The light emitting diode 130 has a width of, for example, 5 μm to 200 μm, and a thickness of, for example, 1 μm to 20 μm, and has a main light emitting area which is about 10% to 60% of the light emitting area. For example, the width of the light emitting diode 130 is about 40 μm, and the main light emitting area accounts for about 16%. The light emitting diode 130 has the first surface 130a and the second surface 130b that are opposite each other, wherein the first surface 130a and the second surface 130b are respectively a surface adjacent to and a surface far away from the substrate 100.

Figure 6:
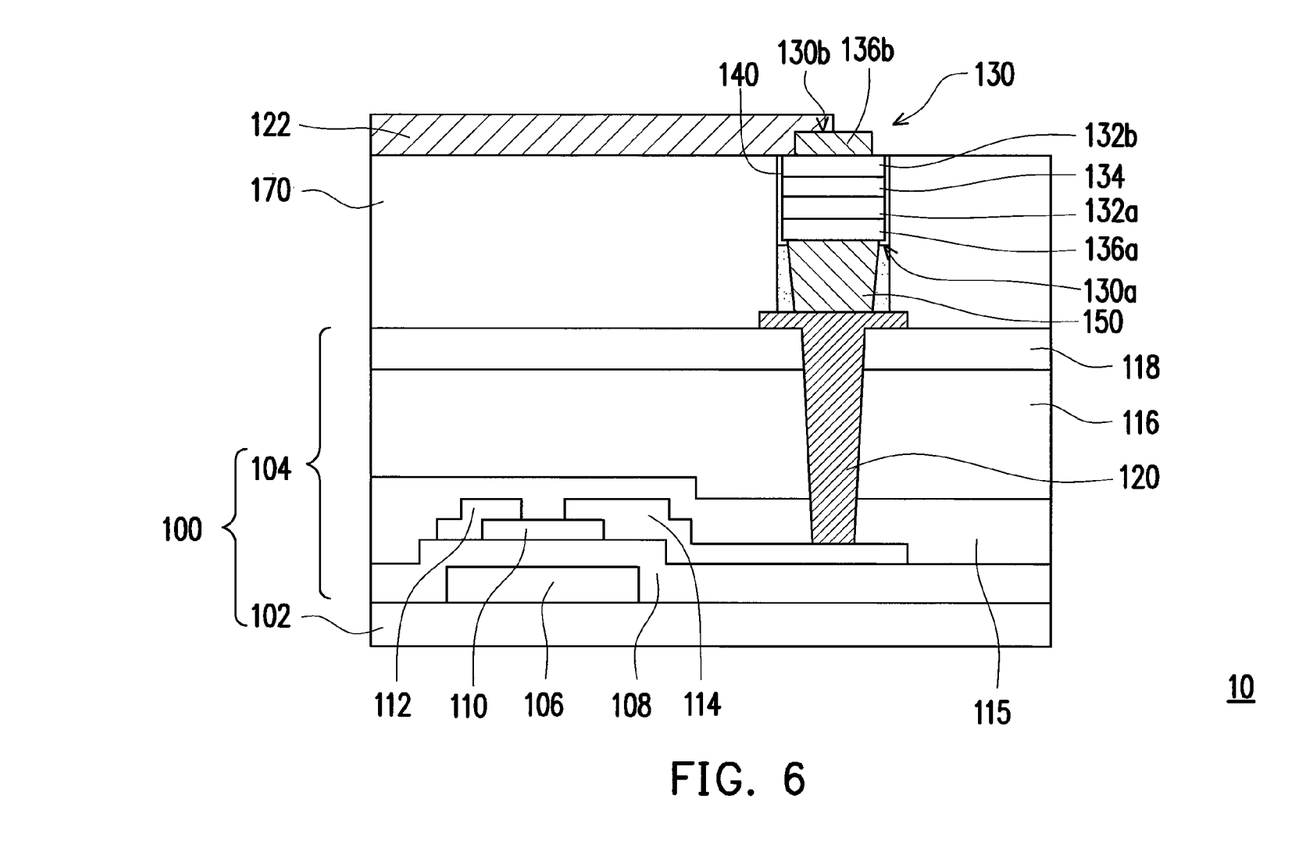
FIG. 6 is a cross-sectional schematic view of a display apparatus according to an embodiment of the disclosure.

In the present embodiment, the first insulating layer 160 is, for example, disposed on the periphery of the first bump 150 and the light emitting diode 130, and contacts the first bump 150 and the first surface 130a. In addition, in the present embodiment, the first insulating layer 160 further surrounds the sidewall of the light emitting diode 130. In the present embodiment, the second insulating layer 170 is disposed on the substrate 100 and surrounds at least an outside of the first insulating layer 160. In the present embodiment, the second insulating layer 170 exposes the second electrode 122. It is worth mentioning that, in the present embodiment, the first insulating layer 160 surrounds the sidewall of the light emitting diode 130. However, the disclosure is not limited thereto. For example, in another embodiment, as shown in FIG. 6, the first insulating layer 160 may expose the sidewall of the light emitting diode 130. Moreover, in an embodiment (not illustrated), if necessary, the second insulating layer 170 may cover the light emitting diode 130.

In the present embodiment, the fabricating method of the display apparatus 10, for example, includes the following steps, wherein the materials and forming methods of the layers can be understood with reference to the description of the previous embodiment, and a main difference therebetween is described herein. First of all, the second type semiconductor layer 132b, the active layer 134, the first type semiconductor layer 132a and the first type electrode 136a are formed in sequence on an epitaxial substrate (not illustrated). Herein, a material of the first type electrode 136a is, for example but not limited to, a metal such as nickel, silver or platinum, or a combination of a transparent conductive material and a Bragg reflector. Next, an etching process is performed on the second type semiconductor layer 132b, the active layer 134, the first type semiconductor layer 132a and the first type electrode 136a, so as to form a mesa structure. Then, the insulating layer 140 is formed on the mesa structure.

Then, the first bump 150 is formed on the first type electrode 136a, and the first insulating layer 160 is formed on the thus formed structure. Next, the above structure is separated from the epitaxial substrate and bonded to the substrate 100. During the bonding, a heating process is further performed on the first bump 150 and the first electrode 120, wherein the first insulating layer 160 located on the periphery of the first bump 150 and the light emitting diode 130 buffers a force acting during the bonding of the above structure to the substrate 100, and avoids the problem of mismatch of thermal expansion coefficients of materials.

After the bonding to the substrate 100 is completed, the second type electrode 136b is formed, thereby completing fabrication of the light emitting diode 130. Then, the second insulating layer 170 is formed on the substrate 100, which exposes at least a portion of the second type electrode 136b. Then, the second electrode 122 is formed on the second insulating layer 170 and is electrically connected to the second type electrode 136b. In addition, at least one of the first insulating layer 160 and the second insulating layer 170 covers the first electrode 120. Specifically, the first insulating layer 160, for example, exposes the outer edge portions of the first electrode 120 and the second electrode 122, while the second insulating layer 170 covers them.

In the above embodiment, the first insulating layer 160 is disposed on the periphery of the first bump 150 and the light emitting diode 130, and contacts the first bump 150 and the first surface 130a, thus providing support to the light emitting diode 130. Moreover, in the steps of separating the light emitting diode 130 from the epitaxial substrate (not illustrated) and bonding the light emitting diode 130 to the substrate 100, the generated stress is buffered, and the problem of mismatch of thermal expansion coefficients of materials due to heating is alleviated. In this way, the display apparatus 10 including the light emitting diode 130 has a good yield. Moreover, since both the first insulating layer 160 and the second insulating layer 170 surround the periphery of the light emitting diode 130, a good protection effect is produced on the light emitting diode 130. In addition, the first insulating layer 160 and the second insulating layer 170 produce effects such as light shielding on the light emitting diode 130, so that light emissions of pixels do not interfere with each other. Therefore, the display apparatus 10 has good device characteristics. On the other hand, although the first insulating layer 160 in the present embodiment exposes a portion (i.e., the outer edge portion) of the first electrode 120, in an embodiment (not illustrated), the first insulating layer 160 may cover the outer edge of the first electrode 120.

In summary, in the disclosure, the first insulating layer is disposed on the periphery of the bump and the light emitting diode and contacts the bump and the first surface, so as to buffer the force acting during the separation of the light emitting diode from the epitaxial substrate or the bonding of the light emitting diode to the substrate, thus reducing the influence caused by the stress. Moreover, the first insulating layer further surrounds the light emitting diode so as to provide good support thereto. In addition, the first insulating layer contacts the outer surface of the substrate so as to more stably fix the bump to the substrate, thus achieving good bonding between the light emitting diode and the substrate. On the other hand, the second insulating layer surrounds a portion of the first insulating layer and is disposed between the light emitting diodes, thus also producing effects such as light shielding or protection on the light emitting diode, so that light emissions of pixels do not interfere with each other. Therefore, the display apparatus including the light emitting diode has good device characteristics or yield.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A display apparatus, comprising:
    a substrate;
    a light emitting diode having a first surface and a second surface opposite each other, wherein the first surface faces the substrate;
    a first bump, wherein the light emitting diode is electrically connected to the substrate through the first bump;
    a first insulating layer disposed on a periphery of the first bump and the light emitting diode, and contacting the first bump and the first surface; and
    a second insulating layer disposed on the substrate and surrounding at least a portion of the first insulating layer.

2. The display apparatus according to claim 1, wherein the substrate further comprises at least one first electrode, and the light emitting diode is electrically connected to the corresponding first electrode through the first bump.

3. The display apparatus according to claim 2, wherein the substrate further comprises at least one second electrode, and the first electrode and the second electrode are electrically connected to the same side of the light emitting diode.

4. The display apparatus according to claim 3, further comprising a second bump, wherein the light emitting diode is electrically connected to the first electrode through the first bump and electrically connected to the second electrode through the second bump, and the first insulating layer is disposed between the first bump and the second bump that are adjacent to each other.

5. The display apparatus according to claim 4, wherein the first insulating layer fills a space formed between the light emitting diode, the first bump and the second bump.

6. The display apparatus according to claim 5, wherein the first insulating layer fills a gap between the first electrode and the second electrode.

7. The display apparatus according to claim 3, wherein the first insulating layer contacts at least a portion of the substrate.

8. The display apparatus according to claim 2, wherein at least one of the first insulating layer and the second insulating layer covers the at least one first electrode.

9. The display apparatus according to claim 2, wherein the substrate further comprises at least one second electrode, and the first electrode and the second electrode are located on two opposite sides of the light emitting diode.

10. The display apparatus according to claim 9, wherein the second insulating layer exposes the second electrode.

11. The display apparatus according to claim 1, wherein the first insulating layer surrounds at least a portion of a sidewall of the light emitting diode.

12. The display apparatus according to claim 1, wherein the second insulating layer surrounds at least a portion of the first insulating layer.

13. The display apparatus according to claim 1, wherein a material of the first insulating layer and the second insulating layer comprises a gel or a resin, and a material of the second insulating layer comprises a transparent material, a black material or a white material.

14. The display apparatus according to claim 1, wherein the light emitting diode exhibit a maximum elevation with respect to the substrate; and a top surface of the second insulating layer is not higher than the maximum elevation.

15. The display apparatus according to claim 1, wherein the light emitting diode exhibit a maximum elevation with respect to the substrate; and a top surface of the second insulating layer is higher than the maximum elevation.

16. A fabricating method of a display apparatus, comprising:
    forming at least one first bump on a light emitting diode and the first bump electrically connected to the light emitting diode;
    forming a first insulating layer, wherein the first insulating layer is disposed on at least a periphery of the first bump and contacts the first bump, and surrounds at least a portion of the light emitting diode;
    bonding the first bump of the light emitting diode to a first electrode of a substrate, so as to bond the light emitting diode to the substrate; and
    forming a second insulating layer on the substrate, wherein the second insulating layer surrounds at least a portion of the light emitting diode.

17. The fabricating method of a display apparatus according to claim 16, wherein the light emitting diode, the first bump and the first insulating layer are formed on an epitaxial substrate, and the fabricating method further comprises, before the bonding step, separating the light emitting diode, the first bump and the first insulating layer from the epitaxial substrate.

18. The fabricating method of a display apparatus according to claim 16, further comprising performing a heating process on the first bump and the first electrode during the bonding step.

19. The fabricating method of a display apparatus according to claim 16, wherein a portion of the first insulating layer is formed around a sidewall of the light emitting diode.

20. The fabricating method of a display apparatus according to claim 16, further comprising forming on the second insulating layer a second electrode of the substrate, wherein the second electrode is electrically connected to the light emitting diode.

* * * * *